United States Patent [19]

Suzuki

[11] Patent Number: 4,949,184

[45] Date of Patent: Aug. 14, 1990

[54] COLOR IMAGE RECORDER WITH CORRECTION OF GRADATION ERRORS IN LIGHT SHIELDING MASK IMAGES AND VISIBLY DEVELOPED IMAGES

[75] Inventor: Makoto Suzuki, Kani, Japan

[73] Assignee: Brother Kogyo Kabushiki Kaisha, Japan

[21] Appl. No.: 391,298

[22] Filed: Aug. 9, 1989

[30] Foreign Application Priority Data

Aug. 9, 1988 [JP] Japan .................................. 63-199277

[51] Int. Cl.$^5$ ...................... B41J 2/465; G01D 15/14; H04N 1/29

[52] U.S. Cl. .................................. 358/300; 346/107 R; 346/108; 346/160; 346/160.1; 346/157; 358/75; 358/302

[58] Field of Search ................. 358/300, 302, 75, 296, 358/298, 455, 461, 456; 346/107 R, 108, 160, 160.1, 157; 250/318, 150, 153.1; 355/32, 326, 327

[56] References Cited

U.S. PATENT DOCUMENTS

| | | | |
|---|---|---|---|
| 4,772,922 | 9/1988 | Kawahara | 355/32 |
| 4,782,352 | 11/1988 | Misono | 346/160.1 |
| 4,785,316 | 11/1988 | Yamamoto | 346/160.1 |
| 4,810,614 | 3/1989 | Sangyoji . | |
| 4,825,256 | 4/1989 | Nakai | 346/150 |
| 4,864,353 | 9/1989 | Okamoto | 346/150 |
| 4,884,082 | 11/1989 | Sonoda | 346/107 R |
| 4,893,010 | 1/1990 | Tomatsu | 250/318 |

Primary Examiner—Bruce A. Reynolds
Assistant Examiner—Scott A. Rogers
Attorney, Agent, or Firm—Oliff & Berridge

[57] ABSTRACT

An image recording apparatus of the type using intermediate mask members having thereon intermediate light shielding images. To reproduce a color image, three mask members are produced which correspond to three primary colors. Each of the mask member carries thereon a light shielding image corresponding to one of the three primary colors contained in the original image wherein the light shielding image yields a first gradation error with respect to the original image. A photosensitive recording medium is successively exposed to light through the mask members to form a latent image corresponding to the light shielding images. The latent image formed on the photosensitive recording medium is developed to provide a visible image on a developer sheet wherein the visible image yields a second gradation error with respect to the light shielding image. To reproduce a color image with no error in gradation expression as compared with the gradation expression of the original image, the first gradation error and the second gradation error is corrected.

5 Claims, 2 Drawing Sheets

COLOR IMAGE RECORDER WITH CORRECTION OF GRADATION ERRORS IN LIGHT SHIELDING MASK IMAGES AND VISIBLY DEVELOPED IMAGES

BACKGROUND OF THE INVENTION

The present invention relates to a color image recording apparatus for recording a color image on a recording medium with the use of intermediate mask members and a photosensitive recording medium.

Various kinds of image recording apparatuses, such as color printer, have been known in the art. One of such apparatuses uses intermediate mask members. In the color recording apparatus using the mask members, light bearing an original image is subjected to color resolution by means of three color resolution filters of red (R), green (G) and blue (B) to split the light into three light beams having wavelengths of red, green and blue. Based on the three light beams, three intermediate mask members are produced by a laser printer, on which light shielding intermediate images are formed. Each of the mask members is superposed on a photosensititive recording medium and the latter is exposed to light through the mask member so that a latent image corresponding to the original image is formed on the photosensitive recording medium.

While such type of recording apparatus is advantageous in comparison with a recording apparatus of the type in which a photosensitive recording medium is directly exposed to a laser beam in that a modulation circuit for modulating a light signal is not required and that an optical system is simple in arrangement, because the recording medium is exposed to light by way of scanning the intermediate images.

In producing the mask members using the laser printer, dither method, such as Bayer method, has been used to enhance gradation reproducibility of the orginal image. In this method, the number of dots to be printed within one pixel on the mask member is determined in accordance with pixel density data in the original document or data regarding ratio of the amount of light reflected from the original document to the amount of light irradiated thereonto, whereupon a predetermined pattern is printed in the corresponding pixel.

However, due to the thickening of the dot caused by an edge effect inherent to an electrophotographic process or by a phenomenon occuring in the course of transferring and fixing processes, a desired image density cannot be obtained by the dither method when an image is produced by the laser printer. Specifically, the density of a half-tone image in the original document changes due to the edge effect or the dot thickening phenomenon. For example, with the laser printer having a resolution of 300 dots/inch, the size of one dot latent formed on a photosensitive drum by the irradiation of a laser beam thereonto is about 85 $\mu$m in diameter. However, the size of the dot outputted from the laser printer is in the range of about 150 to 200 $\mu$m in diameter. Further, in an area on the copied paper where black and white portions co-exists, a large amount of toner powders tends to be adhered to the boundary region in the side of the black portion. As a result, the amouunt of toner to be adhered to the inside of the black portion decreases and hence the density of the black portion is lowered.

As indicated by a dotted line a in FIG. 2, the relation between the number of dots contained within one pixel and the reflection ratio (or the transmission ratio) must theoretically be linear. In actuality, however, the relation between the number of the dots within one pixel on the image reproduced by the laser printer and the reflection ratio (or the transmisson ratio) is as shown by line b in FIG. 2 due to the reasons stated above.

Furthermore, when the photosensitive recording medium is exposed to light through the mask member, the relation between the reflection ratio (or transmission ratio) of the image on the mask member and the reflection ratio (or transmission ratio) of the image formed on a developer sheet is not linear as shown in FIG. 3 but is non-linear or distorted due to the fact that the light irradiated onto the mask member partially enters into the gap between the mask member and the photosensitive medium although the former is bought in facial contact with the latter. For the reasons stated above, gradation cannot be expressed sufficiently accurately.

SUMMARY OF THE INVENTION

The present invention has been made in view of the foregoing circumstance, and it is an object of the invention to provide an image recording apparatus in which a desired color image is reproduced with no error in gradation expression.

In order to achieve the above and other objects, there is provided an image recording apparatus for recording an image of an original document on a developer sheet while using a photosensitive recording medium, the image being expressed with gradations, the apparatus comprising means for producing an intermediate mask member carrying thereon a light shielding image corresponding to the image of the original document wherein the light shielding image yields a first gradation error with respect to the image of the orginal document, means for exposing the photosentive recording medium to light through the intermediate mask member to form a latent image corresponding to the light shielding image, means for developing the latent image formed on the photosensitive recording medium to provide a visible image thereon wherein the visible image yields a second gradation error with respect to the light shielding image, and means for correcting the first gradation error and the second gradation error.

By the provision of the correcting means for eliminating the first gradation error and the second gradation error, an image is reproduced which correctly traces the gradation expression of the original image.

The above and other objects, features and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 5 shows a single mask member on which nine pixel patterns are printed each differing in the number of dots contained within one pixel.

DETAILED DESCRIPTION OF THE PREFERRED EMBODIMENTS

Figure 1:
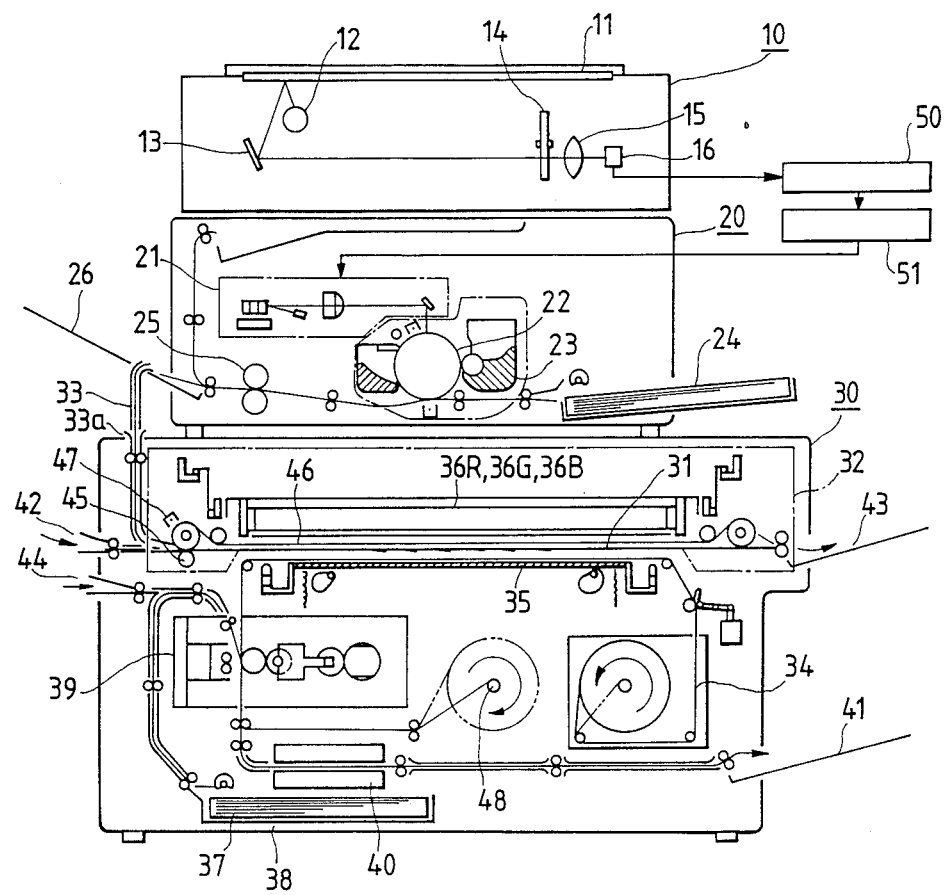
FIG. 1 is a vertical cross-sectional view showing an image recording apparatus according to one embodiment of the present invention.

FIG. 1 shows a color image recording apparatus according to one embodiment of the invention. In the apparatus shown therein, gradation errors are read by a color image scanner 10. The gradation errors occurs in the process of producing mask members and in the process of forming a latent image on a photosensitive recording medium. Based on the image read out by the image scanner 10, conversion data are produced. The gradation correction is performed in accordance with the conversion data thus produced, to compensate for the characteristic of a laser printer 20 which is used for producing an intermediate light shielding image on a mask member. A latent image is formed on a photosensitive recording medium by exposing the latter to light through the mask member, and the latent image formed thereon is developed by a color image recording apparatus 30 to form a visible color image on a developer sheet.

The color image scanner 10 includes a light source 12, such as a fluorescent lamp, which irradiates light onto the image face of an orginal document placed on an original support pane 11, and the light reflected from the original document is oriented by a mirror 13 toward a filter 14. The filter 14 includes a red filter segment, a green filter segment and a blue filter segment and is supported by a filter support (not shown). The light which has passed through one of the filter segments enters a lens 15 and focused on a CCD (charge coupled device) 16. Image data gathered in the CCD 16 is subjected to data convertion in a data converting unit 50 where inputted data is replaced with relevant data.

The laser printer 20 includes a polygon scanner to which a laser beam is incident. The laser beam reflected on one facet of the polygon scanner is applied to a precharged photosensitive drum 22 to thereby form a latent image thereon corresponding to the data replaced in the data converting unit 50. The latent image formed on the photosensitive drum 22 is developed in a developing unit 23 to provide a visible toner image. The toner image is transferred onto an ordinary paper or OHP (overhead projector) sheet supplied from a sheet cassette 24, and then is fixed in a fixing unit 25. The laser printer is adapted to receive data from a host computer (not show) and is capable of recording an image in accordance therewith. By the laser printer 29, the mask members are produced having intermediate light shielding images thereon.

When a monochromatic (black-and-white) image is required, an output image sheet from the laser printer 20 is discharted onto a tray 26. When a color image is desired, an output image sheet from the laser printer 20 is fed into the color image recording apparatus 30 through a sheet path 33.

The color image recording apparatus 30 shown in FIG. 1 records a color image with the use of the mask members produced by the laser printer 20.

More specifically, the color image recording apparatus 30 has a mount 33a on which the sheet path 33 is detachably mounted for supplying the mask members into an exposure unit 32, an exposure table 35 on which the mask member 31 is brought into facial contact with a photosensitive recording medium 34, exposure light sources 36R, 36G, 36B of three primary colors, a color developer sheet cassette 38 for storing a stack of color developer sheets 37 each coated with a color developer material which reacts with dye precursors encapsulated in microcapsules coated on the photosensitive recording medium 34, a pressure developing unit 39 for pressing the color developer sheet 37 and the photosensitive recording medium 34 held in superposed relation to rupture the microcapsules which have not been photocured, thereby providing a color image on the color developer sheet 37, a thermal fixing unit 40 for promoting color development, a sheet discharge tray 41, a manual insertion tray 42 for allowing the mask member to be manually inserted into the apparatus 30, a mask discharge tray 43 onto which the used mask members are discharged, and a manual insertion tray 44 for allowing a color developer sheet to be manually inserted into the apparatus 30.

In a color mode, a mask member 31R produced by the laser printer 20 is passed through the sheet path 23 and fed into anip between rollers 45 by which the leading end of the mask member 31R is positioned. The mask member 31R is electrostatically attached to an insulating sheet carrier 46 such as PET trained around rollers by an electrostatic charge generataor (not shown), such as a corotron, and is then fed into the exposure unit 22. In the exposure unit 32, the mask member 31R and the photosensitive recording medium 34 are held in facial contact with each other by the exposure table 35, and the photosensitive recording medium 34 is exposed to light from the light source 36R through the mask member 31R, thereby producing a latent image corresponding to the mask member 31R on the photosensitive recording medium 34. After the exposure, the mask member 31R is discharged onto the tray 43. The same process is also carried out successively with respect to the mask members 31G, 31B to form color latent images on the photosensitive recording medium 34. The exposed photosensitive recording medium 34 is then superposed on the color developer sheet 37, and the latent images are developed into a color image by the pressure developing unit 39. The color developer sheet 37 is then passed through the thermal fixing unit 40 and discharged onto the tray 41. The used photosensitive recording medium 34 is wound up by a takeup roll 48.

The mask members 31 produced by the laser printer are successively introduced via the sheet path 33 into the color image recording apparatus 30. The mask members 31 are produced for three colors, i.e., red, green and blue. If the period of time during which the photosensitive recording medium 34 is exposed to light from the exposure light sources 36R, 36G, 36B through the mask members 31R, 31G, 31B is longer than the period of time during which the mask members 31R, 31G, 31B, are produced in the laser printer, then control signals are transmitted between the color image recording apparatus 30 and the laser printer 20 to synchronize them because unless the color image recording apparatus 30 were synchronized with the laser printer, the next mask member would come into the apparatus 30 before completion of the exposure of the previous mask member. Even if such synchronization is achieved, however the laser printer 20 may not be available for another purpose while a color image is being recorded, since the output from the laser printer 20 is queued. to avoid this problem, the processing time in the color image recording apparatus 30 is made shorter than the output time in the laser printer 20 so that mask members produced by the laser printer 20 can be accepted by the apparatus 30 at any time, with the result that no control signal is required to be transmitted between the laser printer 20 and the color image recording apparatus 30. A high-speed laser printer can be interfaced with the color image recording apparatus 30 by employing a buffer for the mask members.

Figure 4:
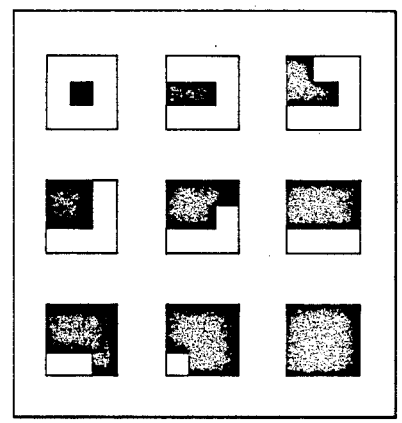
Figure 3:
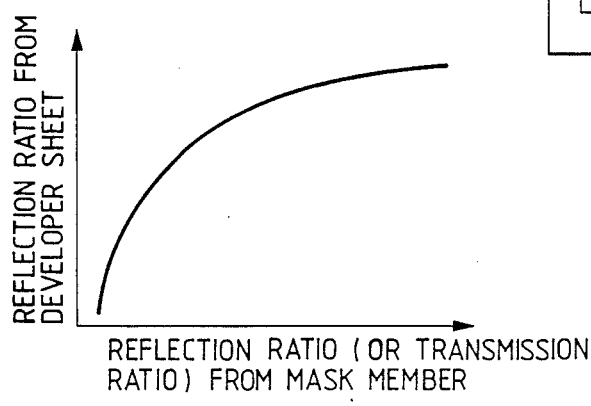
FIG. 3 is a graphical representation showing a relation between a reflection ratio (or transmission ratio) of a light reflected from a mask member and a reflection ratio of a light reflected from a developer sheet on which an image corresponding to the intermediate image of the mask member is formed.

Next, description will be made with respect to the data converting unit 50 and a storage unit 51. The data converting unit 50 produces a convertion table so that relevant data is given with respect to the input data. To provide the conversion table, reference mask members (hereinafter referred to as "gray scale") are firstly produced in which various pixel patterns are printed in each of the gray scale. The number of dots contained within a pixel differs one by one from each other as shown in FIG. 4. Three gray scales are produced while using the three color light sources 36R, 36G, 36B independenly. When the red light source 36R is used, a cyan color gray scale is produced. When the green light source 36G is used, a magenta color gray scale is produced. And, when the blue light source 36B is used, a yellow color gray scale is produced.

Figure 2:
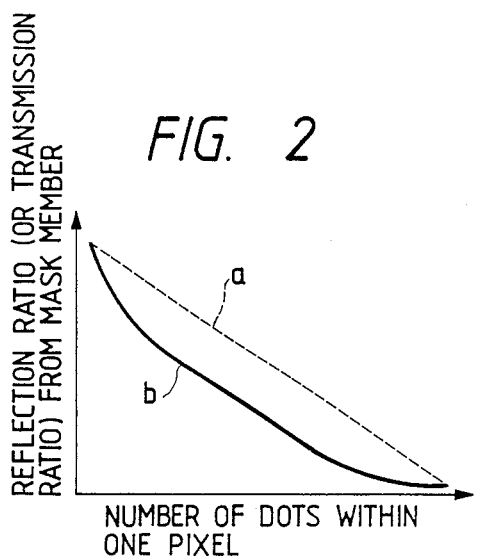
FIG. 2 is a graphical representation showing a relation between the number of dots contained within one pixel and a reflection ratio of a light relected from the pixel.

Each of the gray scales is read out by the color image scanner 10. In accordance with data thus read out by the image scanner 10, conversion table is produced in the data converting unit 50 while referring to the ideal characteristic as shown in FIG. 2 so that the relation between the number of dots contained within one pixel and the reflection ratio (transmission ratio) of the mask member becomes linear. Such conversion data is stored in the storage unit 51.

After storing the convertion data in the storage unit 51, an image on an original document is read out by the image scanner 10 or a color image signal fed from an external unit is applied to the laser printer 20 through the storage unit 51 to produce the mask members corresponnding to the three primary colors. Then, a color image is reproduced in the color image recording appartaus 30. By the process as decribed above, the reproduced image is expressed with quasi-gradation which substatially exactly traces the gradation of the original image.

The operation imposed on the data converting unit 50 can be implemented either by a software or gate array.

If a predetermined conversion table has been stored in the storage unit 51 and when the color image is reproduced in response to a color iomage signal fed from the external unit, the image scanner 10 is not required.

The photosensitive recording medium as used in the present invention is further sensitive to pressure. On the surface of the recording medium, cyan, magenta and yellow microcapsules being uniformly mixed with one another are dispersedly coated. The cyan microcapsule contains a cyan dye chromogenic material as a primary component, a photo-curing resin (or photo-softening resin)), a photosensitizer, a photopolymerization initiator, etc. Likewise, the magenta microcapsule contains a magenta dye chromogenic material as a primary component, a photo-curing resin (or photo-softening resin), a photosensitizer, a photopolymerization initiator, etc. The yellow microcapsule contains a yellow dye chromogenic material as a primary component, a photo-curing resin (or photo-softening resin), a photosensitizer, a photopolymerization initiator, etc. The developer sheet is coated with a developer material which reacts with chromogenic material released from the microcapsules to thus provide a visible image on the developer sheet.

Although the present invention has been described with reference to a specific embodiment, it can be appreciated for those skilled in the art that a variety of changes and modification may be made without departing from the scope and spirit of the invention. For example, although the present invention has been described with respect to the reproduction of color image, the inventive concept is applicable to the reproduction of monochromatic images.

As described, in accordance with the present invention, the gradation error which may be, on the one hand, caused in the process of producing the mask member and the gradation error which, on the other hand, may occur when a latent image is formed on the photosensitive recording medium through the mask member can be corrected. Therefore, the finally reproduced image is expressed with a quasi-gradation tracing the gradation of the original image, and thus a desirable color image can be obtained.

What is claimed is:

1. An image recording apparatus for recording an image of an original document on a developer sheet while using a photosensitive recording medium, the image being expressed with gradations, the apparatus comprising:
   means for producing an intermediate mask member carrying thereon a light shielding image corresponding to the image of the original document wherein the light shielding image yields a first gradation error with respect to the image of the original document;
   means for exposing the photosensitive recording medium to light through the intermediate mask member to form a latent image corresponding to the light shielding image;
   means for developing the latent image formed on the photosensitive recording medium to provide a visible image thereon wherein the visible image yields a second gradation error with respect to the light shielding image; and
   means for correcting the first gradation error and the second gradation error.

2. An image recording apparatus according to claim 1, wherein said correcting means comprises a converting table having data correcting the first gradation error and the second gradation error.

3. An image recording apparatus according to claim 1, wherein said means for priducing produces three mask members each carrying thereon a light shielding image corresponding to one of three primary colors of red, green and blue of the image of the original document, and said means for exposing exposes the photosensitive recording medium to light through the three mask members successively to record a color image of an orginal document on the developer sheet.

4. An image recording apparatus according to claim 3, wherein said correcting means comprises a converting table having data correcting the first gradation error and the second gradation error with respect to each of the three primary colors.

5. An image recording apparatus according to claim 4, wherein the photosensitive recording medium is further sensitive to pressure and is provided with microcapsules encapsulating therein a first material having first and second phases dependent on light exposure, and wherein said developer sheet is provided with a second material which reacts with the first material to provide the visible image.

* * * * *